(12) United States Patent
Dubois

(10) Patent No.: US 10,955,445 B2
(45) Date of Patent: Mar. 23, 2021

(54) AUTOMATIC MILLER PLATEAU SAMPLING

(71) Applicant: NXP B.V., Eindhoven (NL)

(72) Inventor: Antoine Fabien Dubois, San Jose, CA (US)

(73) Assignee: NXP B.V., Eindhoven (NL)

( * ) Notice: Subject to any disclaimer, the term of this patent is extended or adjusted under 35 U.S.C. 154(b) by 30 days.

(21) Appl. No.: 16/417,646

(22) Filed: May 21, 2019

(65) Prior Publication Data

US 2020/0371139 A1 Nov. 26, 2020

(51) Int. Cl.
| | | |
|---|---|---|
| *G01R 19/165* | (2006.01) | |
| *H03K 17/687* | (2006.01) | |
| *H03M 1/12* | (2006.01) | |

(52) U.S. Cl.
CPC ..... *G01R 19/16519* (2013.01); *H03K 17/687* (2013.01); *H03M 1/12* (2013.01)

(58) Field of Classification Search
None
See application file for complete search history.

(56) References Cited

U.S. PATENT DOCUMENTS

| | | | |
|---|---|---|---|
| 7,397,264 B2 | 7/2008 | Dolian | |
| 7,463,079 B2 | 12/2008 | De et al. | |
| 9,039,279 B2 | 5/2015 | Sundaramoorthy et al. | |
| 2003/0180997 A1 | 9/2003 | Nakayama et al. | |
| 2015/0372678 A1* | 12/2015 | Zhang | H03K 17/0822 327/109 |

FOREIGN PATENT DOCUMENTS

| | | |
|---|---|---|
| DE | 102006001874 | 5/2012 |
| WO | 2018186353 A1 | 11/2018 |

* cited by examiner

*Primary Examiner* — Jas A Sanghera

(57) ABSTRACT

A system includes a power transistor having a first drain connected to a load, a first gate connected to a gate driver, wherein the gate driver is configured to drive a first gate voltage on the first gate, and a first source connected to a ground. A sampling transistor includes a second drain connected to the first gate, a second gate connected to the first drain and a second source. A sampling capacitor is connected between the second source and the ground, wherein the sampling transistor is configured to sample a Miller plateau voltage of the first gate voltage on the sampling capacitor, in response to the first gate voltage increasing to the Miller plateau voltage and a first drain voltage of the first drain decreasing to a value equal to the Miller plateau voltage plus a threshold voltage of the sampling transistor.

20 Claims, 6 Drawing Sheets

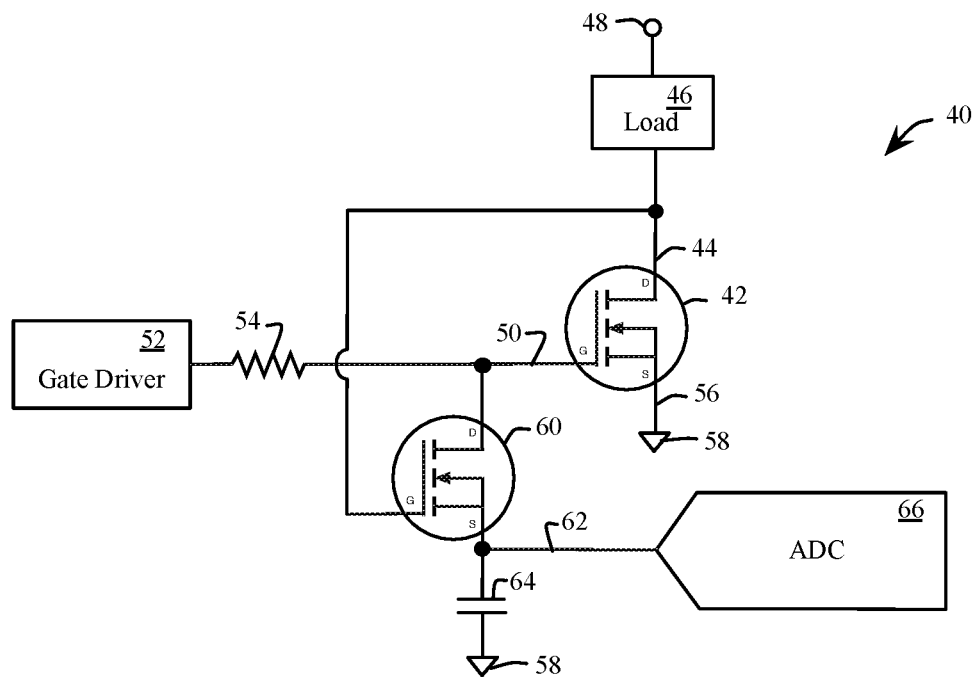
FIG. 3
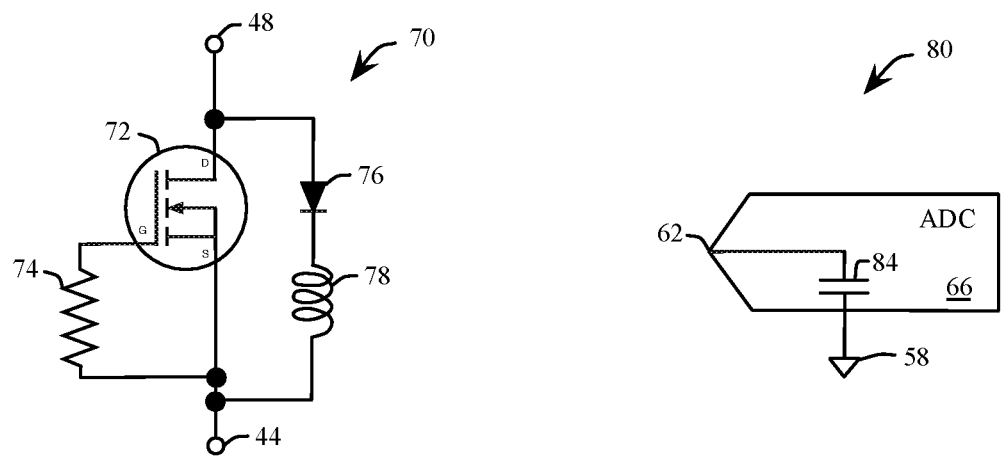
FIG. 4
FIG. 5

AUTOMATIC MILLER PLATEAU SAMPLING

FIELD

This disclosure relates generally to power transistors, and more specifically to measuring the conduction current of a power transistor using a Miller plateau voltage.

BACKGROUND

During activation of a Field Effect Transistor (FET), a portion of the charge from a gate voltage applied to the FET will be absorbed by a parasitic Miller capacitor (e.g., a capacitor between the gate and drain of the FET). While the Miller capacitor is being charged, the voltage on the gate will not increase at the same rate (e.g., the voltage will flatten), while charging the Miller capacitor. This operating regime where the gate voltage is flattened is referred to as the Miller plateau voltage.

Once the Miller capacitor is charged and the FET activated, the gate voltage will then be allowed to continue to rise. The Miller plateau voltage provides valuable information on current conduction through the FET. However, the Miller plateau voltage typically last for a very short duration, hence it is very difficult to measure.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is a schematic view of a system for automatic Miller plateau sampling in accordance with an example embodiment of the present disclosure.

FIG. 4 is a schematic view of a simulated representation of the load shown in FIG. 3.

FIG. 5 is a schematic view of a simulated representation of the Analog to Digital Converter (ADC) shown in FIG. 3.

DETAILED DESCRIPTION

Embodiments described herein provide for a method and apparatus to sample the Miller plateau voltage of a transistor using feedback from a switching event. The Miller plateau voltage is precisely and reliably measured under tight timing constraints, adapting to variations in processing, voltage, temperature and other environmental changes. The measured Miller plateau voltage provides useful information on the current conduction through the FET.

Figure 1:
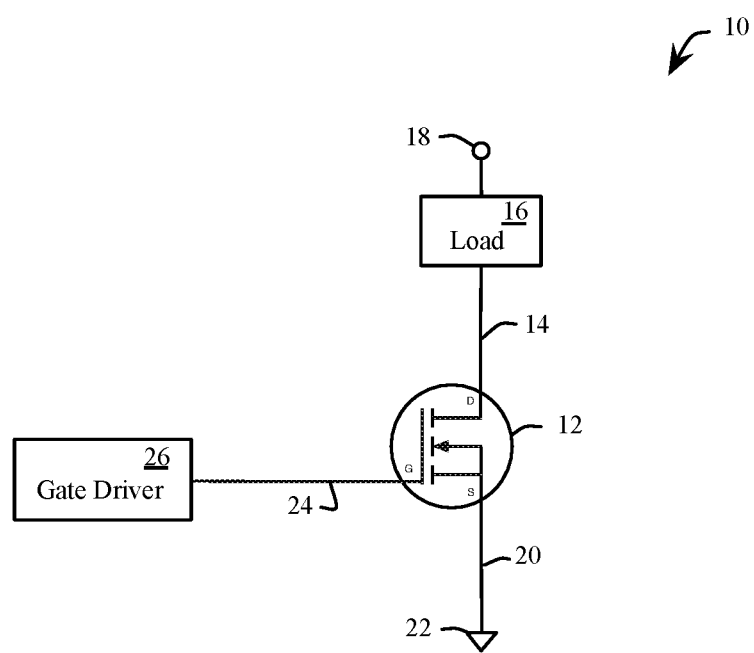
FIG. 1 is a schematic view of a FET configured to conduct current through a load.

FIG. 1 shows an embodiment 10 of a FET 12 used for switching applications. The FET 12 includes a drain 14 connected to a load 16. The load 16 is powered by a voltage supply (e.g., a "supply") 18. The FET 12 includes a source 20 connected to a ground voltage (e.g., a "ground") 22. The FET 12 includes a gate 24 driven by a gate driver 26.

Figure 2:
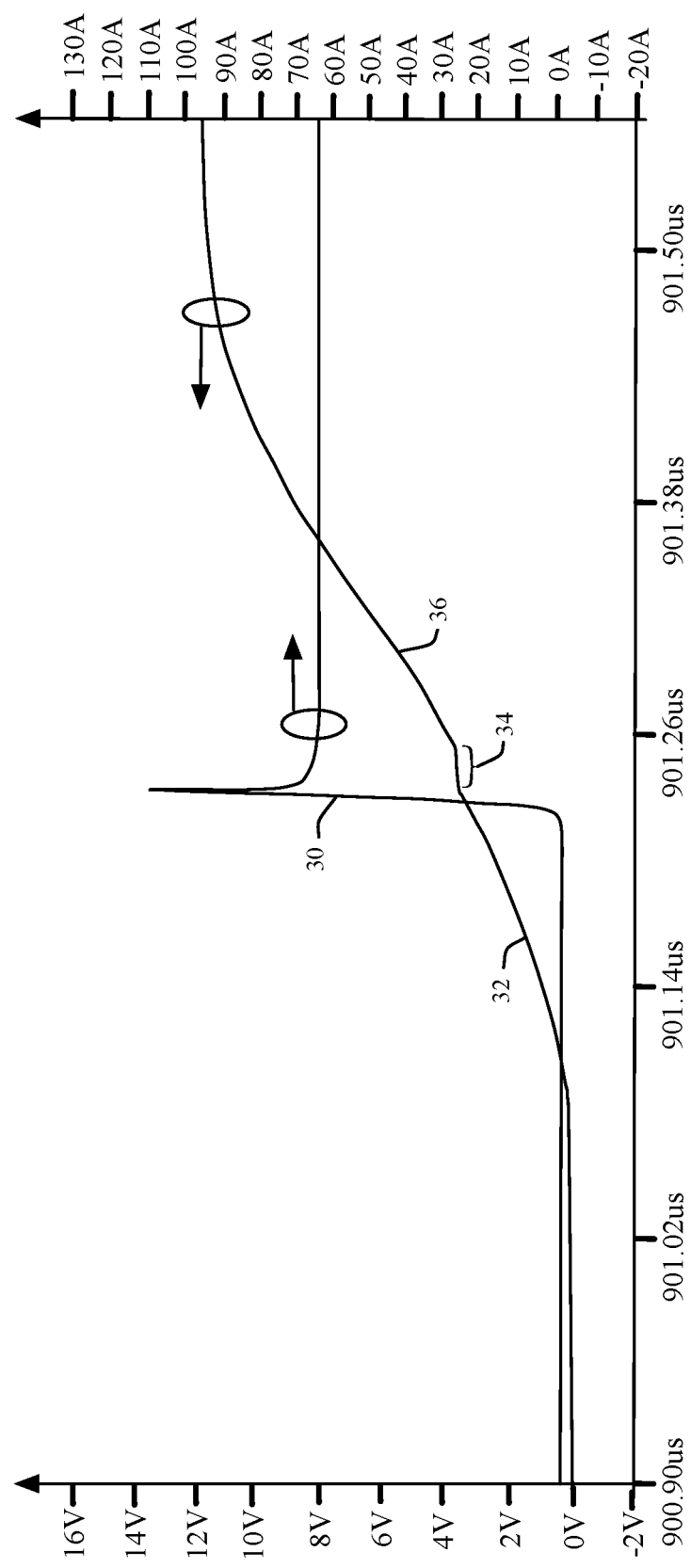
FIG. 2 is a graphical view showing a Miller plateau of the gate voltage during activation of the FET of FIG. 1.

FIG. 2 with reference to FIG. 1, shows a change to a gate voltage applied to the gate 24 (see left axis), and a corresponding drain to source current 30 (see right axis) conducted through the FET 12. Specifically, the gate voltage at 32 is insufficient to activate the FET 12. The gate voltage remains flat, or substantially unchanged during the Miller plateau voltage 34, while charging the Miller capacitance (not shown) between the gate 24 and the drain 14, and subsequently activating the FET 12 by forming a conduction channel. The gate voltage at 36 continues to rise after the Miller capacitance is charged and the FET 12 is activated. The Miller plateau voltage 34 remains substantially unchanged during the phase where the Miller capacitance is being charged, however the duration of this phase is very short and previously has been hard to measure. With reference to FIG. 2, this phase is only 30 ns in duration.

FIG. 3 shows an example embodiment 40 of a system, in accordance with the present disclosure, for determining the Miller plateau voltage by automatic sampling. The embodiment 40 includes a FET 42 with a drain connected to a net 44. The net 44 is connected to a load 46. The load 46 is connected to a voltage supply 48 (e.g., a "supply"). In one example embodiment, the load 46 is a solenoid driver, for example as used in an HVAC system or engine blower in a vehicle. The FET 42 includes a gate connected to a net 50. The net 50 connects to a gate driver 52 through a resistor 54. In one embodiment, the net 50 connects directly to the gate driver 52. The FET 42 includes a source connected to a net 56. The net 56 connects to a ground voltage (e.g., a "ground"). In one embodiment, the FET 42 is a power transistor. It should be appreciated that other variations to the embodiment 40 include a ground 58, which has a lower voltage potential than the supply 48, without being zero volts.

The embodiment 40 includes a FET 60. In one embodiment, the FET 60 is a sampling transistor. The FET 60 includes a drain connected to the net 50, and a gate connected to the net 44. The FET 60 includes a source connected to a net 62. The net 62 connects to a capacitor 64. In one embodiment, the capacitor 64 is a sampling capacitor. The capacitor 64 is connected to the ground 58. In one embodiment, the net 62 connects to an input of an ADC 66. In another embodiment, the ADC 66 is replaced with one or more analog comparators configured to quantize levels of the sampled Miller plateau voltage. In one embodiment, the capacitor 64 is less than, or equal to, one tenth of a capacitance between the gate and source of the FET 42. Preferably, the capacitor 64 is large enough to reduce droop or substantial discharging while the Miller plateau voltage is sampled and held, yet small enough to minimize circuit area. In another example, the capacitor 64 is between 0.1 nC to 1 nC, the FET 60 has a similar breakdown voltage to the FET 42, and the gate capacitor of the FET 60 is less than a gate capacitance of the FET 42.

By reliably sampling the Miller plateau voltage, useful information about the switching of the FET 42 is obtained. For example, the gate voltage is directly proportional to the square root of the current conducted by the FET 42. Determining the conducted current through the FET 42, (and thus through the load 46), is useful for safety or redundancy applications, or to replace a current mirrored branch dedicated to measuring the conducted current.

In one embodiment, an output of the ADC 66 controls a safety device configured to respond to a range of values of the Miller plateau voltage. For example, the range defines a desirable range of operating currents through the load 46, and the safety device indicates a fault condition if the operating current, (as determined by the Miller plateau voltage of the FET 42), is outside that range. In another embodiment, an output of the ADC 66 controls a device configured to detect a short circuit. For example, a short circuit across the load 46 will result in excessive current through the FET 42 and thus a detectable change by measuring the Miller plateau voltage. In another embodiment, an output of the ADC 66 determines a measured current flowing through the FET 42, and thus through the load 46. The safety device may be included in a semiconductor integrated circuit device such as a microprocessor, microcontroller, system on a chip, a system in a package, or other suitable system or device, or may be provided as a separate circuit device.

FIG. 4 shows a schematic view of a simulated representation 70 of the load 46 of FIG. 3. The simulated representation 70 includes a FET 72 with a drain connected to a supply 48. The FET 72 includes a gate connected to the net 44 through a resistor 74, and the drain connected to the net 44 through a diode 76 in series with an inductor 78. In one embodiment, the simulated representation 70 represents the loading of a solenoid driver. FIG. 5 shows a schematic view of a simulated representation 80 of the ADC 66 of FIG. 3. The simulated representation 80 includes a capacitor 84 between the net 62 and the ground 58.

Figure 6:
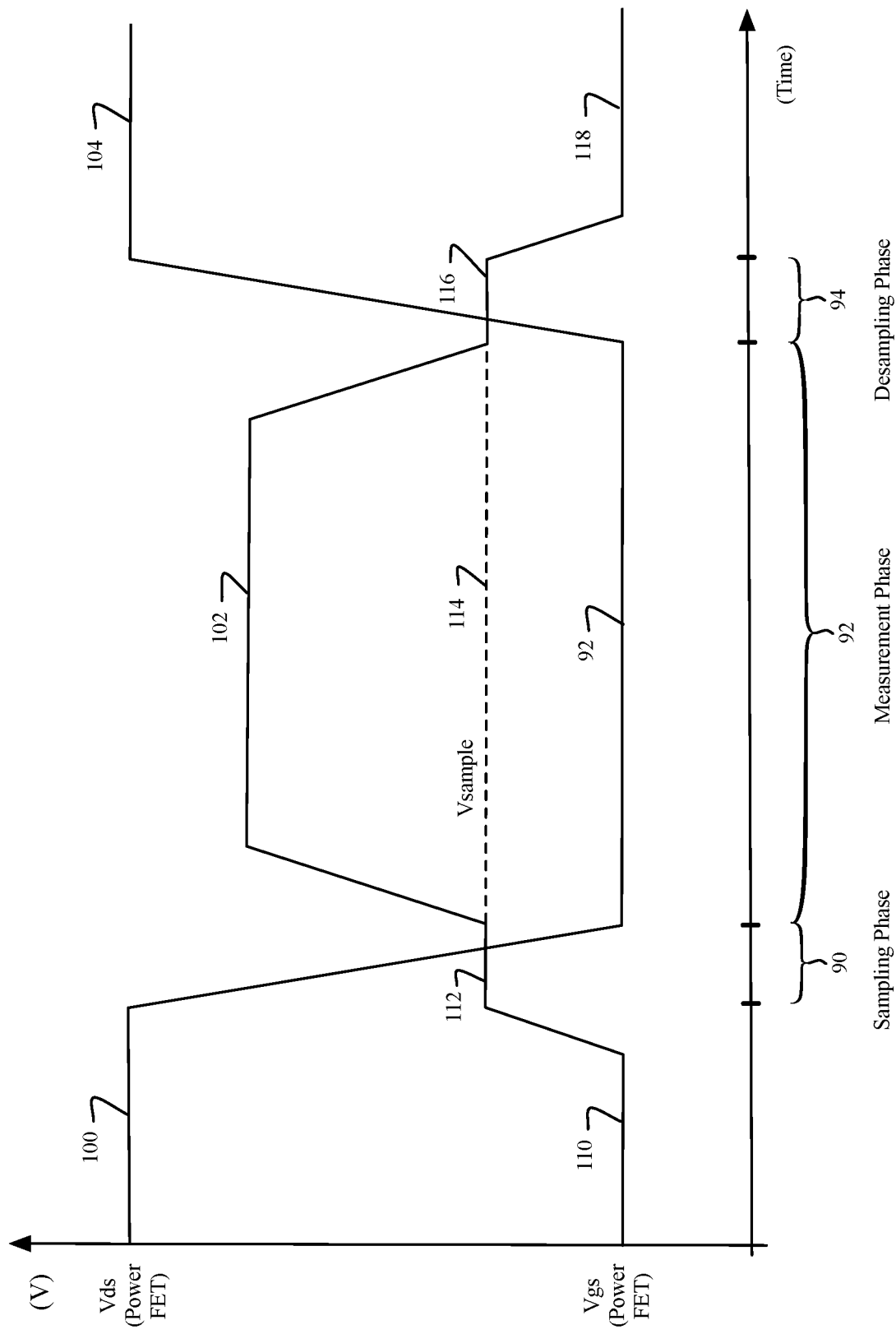
FIG. 6 is a graphical view of timing waveforms of a gate voltage and a drain voltage for a system for automatic Miller plateau sampling in accordance with an example embodiment of the present disclosure.

With reference to FIG. 3 and FIG. 6, a method for sampling the Miller plateau voltage during activation of the FET 42 is described. Initially, a gate voltage (Vgs) of the FET 42 on net 50 is driven to a low voltage 110 by the gate driver 52. Accordingly, the drain of the FET 60 is also driven low, the FET 42 is deactivated, and the drain of the FET 42 is pulled high through the load 46. Hence, the gate of the FET 60 is high and the FET 60 is activated. Activating the FET 60 fully discharges the capacitor 64 to the ground 58.

When the gate voltage of the FET 42 is increased to a level where the FET 42 is activated (e.g. the gate to source voltage exceeds the threshold of the FET 42), the drain of the FET 42 still remains at a high voltage level 100, hence the FET 60 remains activated and the voltage on the capacitor 64 follows the gate voltage on net 50. When the gate voltage of the FET 42 reaches the Miller plateau voltage 112, the Miller capacitor between the gate and drain of the FET 42 charges, hence the gate voltage does not substantially change, as shown by voltage 112. After the Miller capacitor is charged, the drain of the FET 42 will begin to decrease, which will deactivate the FET 60 and cause the capacitor 64 to sample or retain the Miller plateau voltage as shown by a sampled voltage 114, and the sampling phase 90. Accordingly the drain to source voltage of the FET 42 decreases from the high voltage level 100 to a low voltage level 92.

During a measurement phase 92, the gate voltage of the FET 42 is allowed to continue to increase to a high level 102 set by the gate driver 52. The sampled voltage 114 remains stable for measurement by an ADC 66 for example. Following the measurement phase 92, a desampling phase 94 is performed to reset the capacitor 64. During the desampling phase 94, the gate voltage of the FET 42 is reduced from the high level 102 and the drain of the FET 42 will increase from the low voltage level 92 towards the high voltage level 104.

When the gate voltage of the FET 42 decreases below the sampled voltage 114 by the forward diode drop of a body diode of the FET 60, at voltage 116, the sampled voltage 114 begins to discharge through the body diode of the FET 60 (e.g., the parasitic diode having an anode connected to the shorted source and substrate connected of the FET 60 and having a cathode connected to the drain of the FET 60). Subsequently, when the gate voltage of the FET 42 decreases to the sampled voltage 114 plus a threshold voltage of the FET 60, the FET 60 will activate and completely discharge the capacitor 64 to the ground 58, thereby resetting the capacitor 64.

Figure 7:
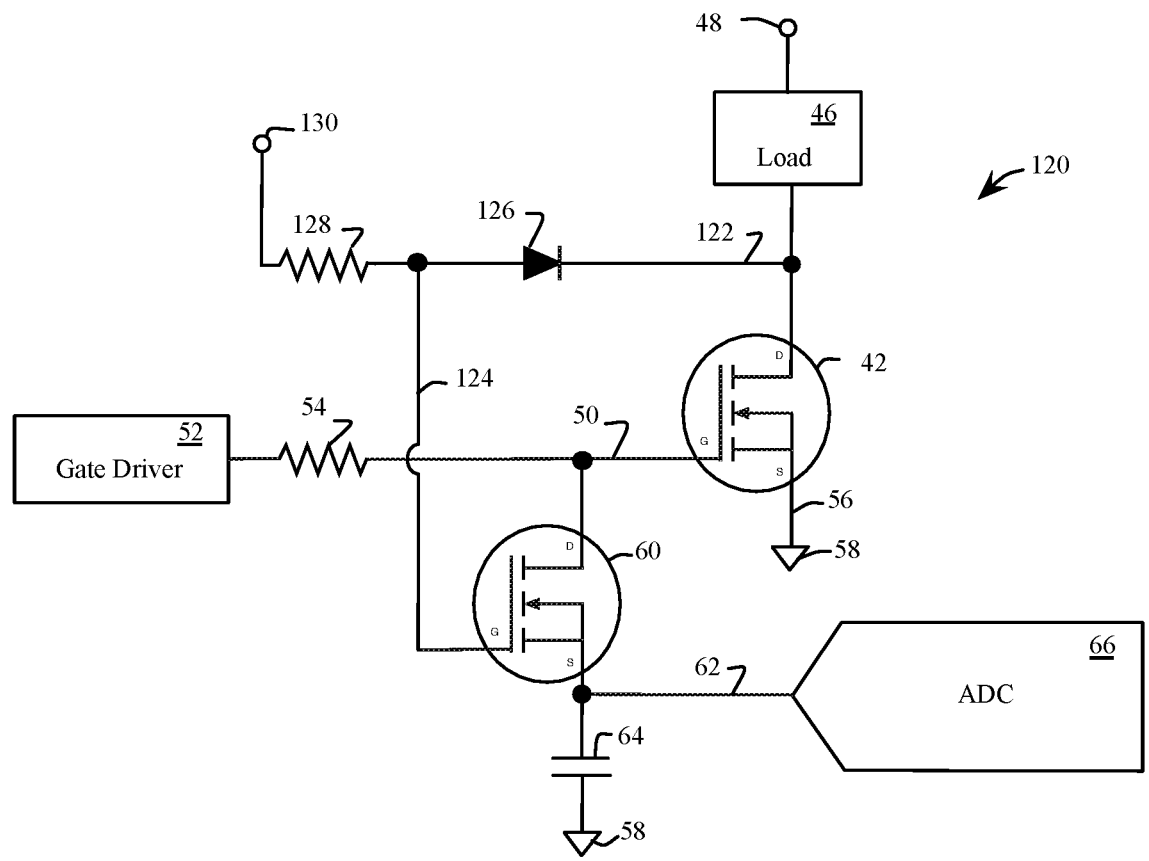
FIG. 7 is a schematic view of a system for automatic Miller plateau sampling in accordance with an example embodiment of the present disclosure.

Referring now to FIG. 7, with continued reference to FIG. 3, another embodiment 120 of a system for automatic Miller plateau sampling is described. In embodiment 120, the net 122 is decoupled from the net 124 by a diode 126. The net 124 is further biased with a resistor coupled to a supply 130. In one embodiment, the supply 130 is the same as the supply 48. In another embodiment, the supply 130 is separate from the supply 48. In various embodiments, a voltage on the net 122 is 48V, 400V or 1000V. By adding a bias current to the net 124 through the resistor 128 sufficient to activate the FET 60 and a diode 126 pulling down the net 124 to deactivate the FET 60, the FET 60 is protected from high load voltages on the net 122. In one embodiment, the diode 126 is a Schottky diode. In one embodiment, the gate voltage from the gate driver is driven to 12V, capacitor 64 is one tenth of the gate to source capacitance of the FET 42, the RDSon (e.g. drain to source resistance) of the FET 42 is approximately 1 ohm, the gate charge on the FET 42 is 10 nC, the diode 126 has a 1 A maximum capacity, and the resistor is 10 ohms, for example. Components with other suitable current, capacitance, and resistance values can be used.

Figure 8:
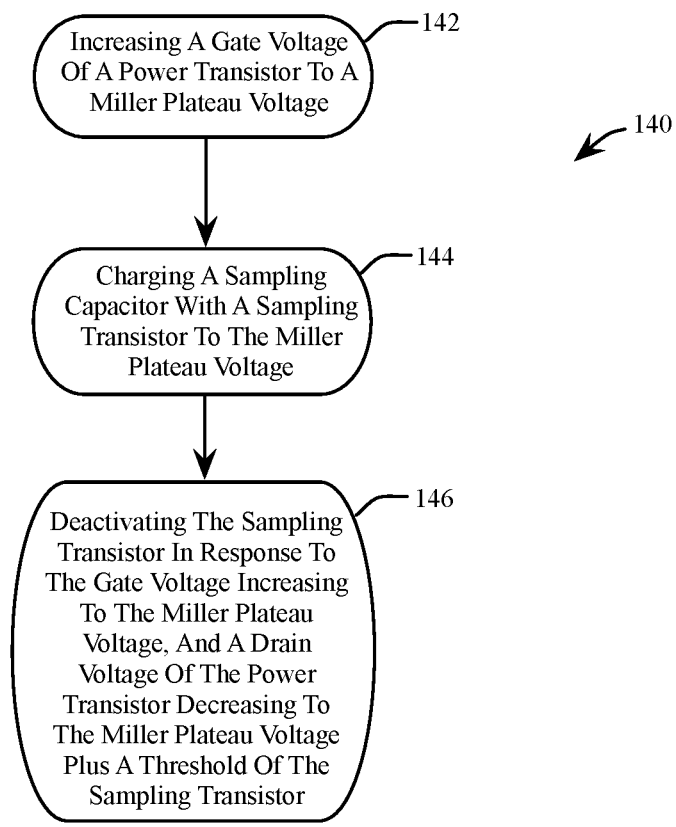
FIG. 8 is a flowchart representation of a method for automatic Miller plateau sampling in accordance with an example embodiment of the present disclosure.

FIG. 8 with reference to FIG. 3, shows a method 140 for automatic Miller plateau sampling in accordance with an example embodiment of the present disclosure. At 142, a gate voltage of a power transistor 42 is increased to a Miller plateau voltage 112. At 144, a sampling capacitor 64 is charged with a sampling transistor 60 to the Miller plateau voltage 114. At 146, the sampling transistor 60 is deactivated in response to the gate voltage increasing to the Miller plateau voltage 112, and a drain voltage of the power transistor 42 decreasing to the Miller plateau voltage 116 plus a threshold of the sampling transistor 60.

As will be appreciated, embodiments as disclosed include at least the following. In one embodiment, a system comprises a power transistor comprising a first drain connected to a load, a first gate connected to a gate driver, wherein the gate driver is configured to drive a first gate voltage on the first gate, and a first source connected to a ground. A sampling transistor comprises a second drain connected to the first gate, a second gate connected to the first drain and a second source. A sampling capacitor is connected between the second source and the ground, wherein the sampling transistor is configured to sample a Miller plateau voltage of the first gate voltage on the sampling capacitor, in response to the first gate voltage increasing to the Miller plateau voltage and a first drain voltage of the first drain decreasing to a value equal to the Miller plateau voltage plus a threshold voltage of the sampling transistor.

Alternative embodiments of the system for automatic Miller plateau sampling include one of the following features, or any combination thereof. The second gate is decoupled from the first drain with a diode, wherein the second gate is connected to an anode of the diode, the first drain is connected to a cathode of the diode, and the anode of the diode is connected to a supply through a resistor. The diode is a Schottky diode. An Analog to Digital Converter (ADC) is connected to the second source, wherein the ADC is configured to sample the Miller plateau voltage. The power transistor is a Field Effect Transistor. The sampling transistor is a Field Effect Transistor. A first body terminal of the power transistor is connected to the first source, and a second body terminal of the sampling transistor is connected to the second source. A sampling capacitance of the sampling capacitor is equal to, or less than, one tenth of a first capacitance between the first gate and the first source. The sampling capacitor is configured to discharge to a ground voltage of the ground, in response to a decrease of the first gate voltage to the Miller plateau voltage and an increase of the first drain voltage of the first drain to a value equal to the Miller plateau voltage plus a threshold voltage of the sampling transistor.

In another embodiment, a method for automatic Miller plateau sampling comprises increasing a gate voltage of a gate driver to a Miller plateau voltage, wherein the gate driver is connected to a first gate of a power transistor. A sampling capacitor is charged with a sampling transistor to the Miller plateau voltage, wherein a first drain of the power transistor is connected to a second gate of the sampling transistor, the first gate is connected to a second drain of the sampling transistor, a first source of the power transistor is connected to a ground, and the sampling capacitor is connected between a second source of the sampling transistor and the ground. The sampling transistor is deactivated in response to the gate voltage increasing to the Miller plateau voltage, and a first drain voltage of the first drain decreasing to a value equal to the Miller plateau voltage plus a threshold of the sampling transistor.

Alternative embodiments of the method for automatic Miller plateau sampling include one of the following features, or any combination thereof. Decoupling the second gate from the first drain with a diode, wherein the second gate is connected to an anode of the diode, the first drain is connected to a cathode of the diode, and the anode of the diode is connected to a supply through a resistor. Measuring the Miller plateau voltage on the second source with an Analog to Digital Converter (ADC) connected thereto. Controlling a safety device, configured to respond to a range of values of the Miller plateau voltage, with an output of the ADC. Controlling a device, configured to detect a short circuit, with an output of the ADC. Determining a measured current flowing through the power transistor, with an output of the ADC. Discharging the sampling capacitor to a ground voltage of the ground, in response to the first gate voltage decreasing to the Miller plateau voltage and a first drain voltage of the first drain increasing to a value equal to the Miller plateau voltage plus a threshold voltage of the sampling transistor.

In another embodiment, a system comprises a first transistor comprising a first drain connected to a load, a first gate connected to a gate driver, wherein the gate driver is configured to drive a first gate voltage on the first gate, and a first source connected to a ground and to a first body terminal of the first transistor. A second transistor comprises a second drain connected to the first gate, a second gate connected to an anode of a diode, the anode of the diode connected to a supply through a resistor, the first drain connected to a cathode of the diode, and a second source connected to a second body terminal of the second transistor. A capacitor is connected between the second source and the ground, wherein the second transistor is configured to sample a Miller plateau voltage of the first gate voltage on the capacitor, in response to the first gate voltage increasing to the Miller plateau voltage and a first drain voltage of the first drain decreasing to a value equal to the Miller plateau voltage plus a threshold voltage of the second transistor.

Alternative embodiments of the system for automatic Miller plateau sampling include one of the following features, or any combination thereof. An Analog to Digital Converter (ADC) is connected to the second source, wherein the ADC is configured to sample the Miller plateau voltage. A sampling capacitance of the capacitor is equal to, or less than, one tenth of a first capacitance between the first gate and the first source. The sampling capacitor is configured to discharge to a ground voltage of the ground, in response to a decrease of the first gate voltage to the Miller plateau voltage and an increase of the first drain voltage of the first drain to a value equal to the Miller plateau voltage plus a threshold voltage of the sampling transistor.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A system comprising:
a power transistor comprising a first drain connected to a load, a first gate connected to a gate driver, wherein the gate driver is configured to drive a first gate voltage on the first gate, and a first source connected to a ground;
a sampling transistor comprising a second drain connected to the first gate, a second gate connected to the first drain and a second source; and
a sampling capacitor connected between the second source and the ground, wherein the sampling transistor is configured to sample a Miller plateau voltage of the first gate voltage on the sampling capacitor, in response to the first gate voltage increasing to the Miller plateau voltage and a first drain voltage of the first drain decreasing to a value equal to the Miller plateau voltage plus a threshold voltage of the sampling transistor.

2. The system of claim 1 wherein the second gate is decoupled from the first drain with a diode, wherein the second gate is connected to an anode of the diode, the first drain is connected to a cathode of the diode, and the anode of the diode is connected to a supply through a resistor.

3. The system of claim 2 wherein the diode is a Schottky diode.

4. The system of claim 1 further comprising an Analog to Digital Converter (ADC) connected to the second source, wherein the ADC is configured to sample the Miller plateau voltage.

5. The system of claim 1 wherein the power transistor is a Field Effect Transistor.

6. The system of claim 1 wherein the sampling transistor is a Field Effect Transistor.

7. The system of claim 1 further comprising a first body terminal of the power transistor connected to the first source, and a second body terminal of the sampling transistor connected to the second source.

8. The system of claim 1 wherein a sampling capacitance of the sampling capacitor is equal to, or less than, one tenth of a first capacitance between the first gate and the first source.

9. The system of claim 1 wherein the sampling capacitor is configured to discharge to a ground voltage of the ground, in response to a decrease of the first gate voltage to the Miller plateau voltage and an increase of the first drain voltage of the first drain to a value equal to the Miller plateau voltage plus the threshold voltage of the sampling transistor.

10. A method for automatic Miller plateau sampling comprising:
    increasing a gate voltage of a gate driver to a Miller plateau voltage, wherein the gate driver is connected to a first gate of a power transistor;
    charging a sampling capacitor with a sampling transistor to the Miller plateau voltage, wherein a first drain of the power transistor is connected to a second gate of the sampling transistor, the first gate is connected to a second drain of the sampling transistor, a first source of the power transistor is connected to a ground, and the sampling capacitor is connected between a second source of the sampling transistor and the ground; and
    deactivating the sampling transistor in response to the gate voltage increasing to the Miller plateau voltage, and a first drain voltage of the first drain decreasing to a value equal to the Miller plateau voltage plus a threshold of the sampling transistor.

11. The method of claim 10 further comprising decoupling the second gate from the first drain with a diode, wherein the second gate is connected to an anode of the diode, the first drain is connected to a cathode of the diode, and the anode of the diode is connected to a supply through a resistor.

12. The method of claim 10 further comprising measuring the Miller plateau voltage on the second source with an Analog to Digital Converter (ADC) connected thereto.

13. The method of claim 12 further comprising controlling a safety device, configured to respond to a range of values of the Miller plateau voltage, with an output of the ADC.

14. The method of claim 12 further comprising controlling a device, configured to detect a short circuit, with an output of the ADC.

15. The method of claim 12 further comprising determining a measured current flowing through the power transistor, with an output of the ADC.

16. The method of claim 10 further comprising discharging the sampling capacitor to a ground voltage of the ground, in response to the first gate voltage of the gate driver decreasing to the Miller plateau voltage and the first drain voltage of the first drain increasing to a value equal to the Miller plateau voltage plus the threshold voltage of the sampling transistor.

17. A device comprising:
    a first transistor comprising a first drain connected to a load, a first gate connected to a gate driver, wherein the gate driver is configured to drive a first gate voltage on the first gate, and a first source connected to a ground and to a first body terminal of the first transistor;
    a second transistor comprising a second drain connected to the first gate, a second gate connected to an anode of a diode, the anode of the diode connected to a supply through a resistor, the first drain connected to a cathode of the diode, and a second source connected to a second body terminal of the second transistor; and
    a capacitor connected between the second source and the ground, wherein the second transistor is configured to sample a Miller plateau voltage of the first gate voltage on the capacitor, in response to the first gate voltage increasing to the Miller plateau voltage and a first drain voltage of the first drain decreasing to a value equal to the Miller plateau voltage plus a threshold voltage of the second transistor.

18. The device of claim 17 further comprising an Analog to Digital Converter (ADC) connected to the second source, wherein the ADC is configured to sample the Miller plateau voltage.

19. The device of claim 17 wherein a sampling capacitance of the capacitor is equal to, or less than, one tenth of a first capacitance between the first gate and the first source.

20. The device of claim 17 wherein the capacitor is configured to discharge to a ground voltage of the ground, in response to a decrease of the first gate voltage to the Miller plateau voltage and an increase of the first drain voltage of the first drain to a value equal to the Miller plateau voltage plus the threshold voltage of the second transistor.

* * * * *